United States Patent [19]

Kumada

[11] Patent Number: 4,894,607
[45] Date of Patent: Jan. 16, 1990

[54] SURFACE POTENTIAL DETECTING APPARATUS
[75] Inventor: Akira Kumada, Kyoto, Japan
[73] Assignee: Murata Manufacturing Co., Ltd., Japan
[21] Appl. No.: 254,457
[22] Filed: Oct. 6, 1988
[30] Foreign Application Priority Data Oct. 6, 1987 [JP] Japan .................... 62-251852

[51] Int. Cl.$^4$ .................... G01R 23/16; G02F 1/03
[52] U.S. Cl. .................... 324/96; 324/158 R; 324/457; 324/458; 350/356
[58] Field of Search .................... 324/96, 158 R, 109, 324/457, 458; 350/356, 355, 390; 250/225, 231 R; 455/617, 619

[56]   References Cited
U.S. PATENT DOCUMENTS

| 3,639,771 | 2/1972 | Borrelli et al. | 350/390 X |
| 3,700,912 | 10/1972 | Glass et al. | 350/390 X |
| 4,465,969 | 8/1984 | Tada et al. | 324/458 |
| 4,786,858 | 11/1988 | Haas et al. | 324/96 X |

Primary Examiner—Ernest F. Karlsen
Assistant Examiner—Vinh P. Nguyen
Attorney, Agent, or Firm—Ostrolenk, Faber, Gerb & Soffen

[57] ABSTRACT

A surface potential detecting apparatus includes an electro-optical crystal element (22), wherein an electric field from a surface to be measured is directly or indirectly applied to a measuring electrode (24) of the electro-optical crystal element, and an alternating voltage which is obtained by stepping up an oscillating voltage generated in an oscillating circuit (35) is applied to a reference electrode (25) of the element from a step up circuit (34). Light which passes through the electro-optical crystal element is received by a photosensitive unit (30). Zero electric field is detected (31) based on the output of the photo sensitive unit, and a trigger signal is held in a hold circuit (32). An output circuit (33) outputs the held voltage. Therefore, in this surface potential detecting apparatus, the detecting precision is not degraded by mechanical factors, the detection output is not dependent on the distance to the surface whose potential is being detected, and the potential of the surface to be measured can be measured in a no-contact manner at high speed.

13 Claims, 3 Drawing Sheets

SURFACE POTENTIAL DETECTING APPARATUS

BACKGROUND OF THE INVENTION

Field of the Invention

The present invention relates to a surface potential detecting apparatus. More specifically, the present invention relates to a surface potential detecting apparatus suitable for use as a sensor detecting a drum potential of a Plain Paper Copy machine.

Description of the Prior Art

Conventional surface potential detecting apparatuses can be divided into the active type and the passive type from the functional point of view, and they can be divided into the mechanical type and the electrical type from the structural point of view.

An active type apparatus itself has an electric field generating means, whereby it generates the same potential as the surface to be measured at a detecting surface of the detecting apparatus, so as to make the electric field zero between the surface to be measured and the detecting surface of the detecting apparatus, and whereby it detects the potential of the surface to be measured. A passive type apparatus detects the potential of the surface to be measured utilizing the electric field from the surface to be measured, which enters the detecting surface and is induced on the detecting surface as a reference. In principle, the active type apparatus does not depend on the distance between the surface to be measured and the detecting surface, while the passive type apparatus depends on the distance. In a mechanical type apparatus, a piezoelectric tuning fork is generally used as an oscillator, and the electric field generated from the surface to be measured is modulated and detected by the mechanical means. An electric type apparatus employs an electro-optical crystal or a surface acoustic wave device to detect in non-mechanical manner.

Refferring to FIG. 6, a prior passive and mechanical type surface potential detecting apparatus comprises an electrode 1 having a detecting surface arranged spaced apart from and opposed to the surface 2 to be measured. A chopper 3 formed of a piezoelectric tuning fork is arranged between the electrode 1 and the surface 2 to be measured. FIG. 7 shows a prior active and mechanical type surface potential detecting apparatus which comprises an electrode 4 having a detecting surface arranged spaced apart from and opposed to the surface 5 to be measured. A chopper 6 formed of a piezoelectric tuning fork is arranged between the electrode 4 and the surface 5 to be measured. In addition, a reference electrode 7 is arranged between the chopper 6 and the surface 5 to be measured. FIG. 8 shows a prior passive and electrical type surface potential detecting apparatus which comprises an electrode 8 having a detecting surface arranged spaced apart from and opposed to the surface 9 to be measured. The electrode 8 is electrically connected to one electrode 11 of an electrooptical crystal 10, and it applies a voltage to the electrode 11 based on the electric field received by the electrode 8. A light emitting unit 12 comprising a light emitting diode and a photosensitive unit 13 comprising a phototransistor are also connected to the electrooptical crystal 10 through an optical fiber 14.

In the conventional mechanical type surface potential detecting apparatuses such as shown in FIGS. 6 and 7, the precision in detection is degraded as the time passes, and they are easily damaged by physical shocks. In the passive type surface potential detecting apparatuses such as shown in FIGS. 6 and 8, the surface potential can not be detected quickly in a simple manner, since the detection output depends on the distance to the surface to be detected. In the passive and electrical type surface potential detecting apparatus such as shown in FIG. 8, the permittivity of the electro-optical crystal itself is high, and therefore, the electic field induced in the crystal is not strong enough. Therefore, although the surface potential detecting apparatus of FIG. 8 is theoretically usable, the practical application of the apparatus is difficult. In addition, in the structure of FIG. 8, the electro-optical crystal requires a precise electro-optical characteristic, making it difficult to maintain stable detecting operation.

SUMMARY OF THE INVENTION

Therefore, an object of the present invention is to provide an electrical type surface potential detecting apparatus which is relatively inexpensive, in which there is no degradation of its detecting pecision caused by mechanical factors, whose detection output does not depend on the distance to the surface, and which can measure the potential of the surface to be measured at high speed and in a non-contact manner.

Briefly stated, the present invention comprises an electro-optical crystal element having a measuring electrode to which an electric field from the surface to be measured is directly or indirectly applied, and a reference electrode for generating a potential difference between itself and the measuring electrode; an alternating voltage of a prescribed frequency is supplied to the reference electrode; the intensity of the electric field formed between the measuring electrode and the reference electrode is detected as the intensity of transmitting light; amd the intensity of the electric field of the surface to be measured is arithmetically processed based on the detected intensity. Therefore, in accordance with the present invention, since the apparatus is an active type employing a reference electrode, the detection output does not fluctuate even when the distance between the surface to be measured and the detecting apparatus changes, whereby the surface potential can be measured easily at high speed. In addition, since an electro-optical crystal element is employed, the apparatus has no portion which is mechanically movable, and therefore, the precision is not degraded by mechanical factors. Since the mechanically movable portion is eliminated by employing the electro-optical crystal element, the whole apparatus can be made compact. Since the minimum value of the intensity of the electric field formed between the measuring electrode and the reference electrode is detected as the intensity of the transmitted light, the characteristics of the electro-optical crystal element to be employed need not be strictly limited, whereby an inexpensive electro-optical crystal element may be used to reduce the cost.

DESCRIPTION OF THE PREFERRED EMBODIMENT

Figure 1:
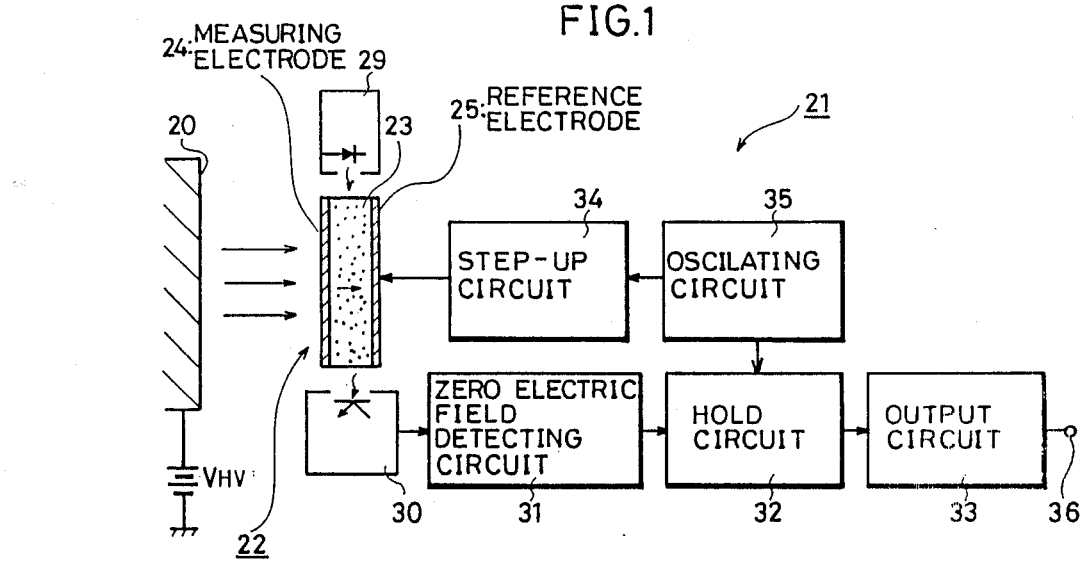
FIG. 1 is a block diagram showing one embodiment of the present invention.

Referring to FIG. 1, a surface potential detecting apparatus 21 is arranged adjacent to a surface 20 whose surface potential is to be measured.

An electro-optical crystal element 22 of the surface potential detecting apparatus 21 is an approximately rectangular solid member, having an electro-optical crystal 23, and a measuring electrode 24 and a reference electrode 25 formed on both main surfaces thereof. The electro-optical crystal 23 is formed of a material having a field axis and an optical axis showing a primary electro-optic effect crossing orthogonal to each other, such as a $BaTiO_3$ single crystal. For example, the electro-optical crystal 23 may be formed of a single bulk crystal or a thin film mainly formed of a material selected from the group consisting of $BaTiO_3$, $LiNbO_3$, $Ba_2NaNbO_{15}$, $(K, Li)NbO_3$, $LiTaO_3$, $(Sr, Ba)Nb_2O_6$. The optical pass length in the electro-optical crystal 23 is determined such that the polarization in the crystal will be about 90° when the electric field applied to the electro optical crystal 23 becomes maximum. Since the function of the electro-optical-crystal 23 is to detect zero electric field, it does not require a precise relation between the intensity of the electric field and the polarizing angle as did the crystal employed for detecting the electric field in the prior art, as will be described later. Therefore, the electrical and optical characteristics of the electro-optical crystal 23 need not be so strictly limited as in the prior art. The intensity of the electric field applied to the electro-optical crystal and the optical path length in the crystal for setting the polarizing angle in the electro-optical crystal can be arbitrarily set in accordance with angles of polarizing surfaces of polarizers provided in front of and behind the electro optical crystal 23, with the structure of a circuit detecting the zero electric field in the electro-optical crystal upon reception of an optical signal, and with the detection precision required for the detecting apparatus. The said reference electrode 25 is adapted to receive a high alternating voltage, as will be described later. Therefore, the electro-optical crystal 23 will be arranged in the electro field formed between the reference electrode 25 and the surface 20 to be measured.

Figure 2:
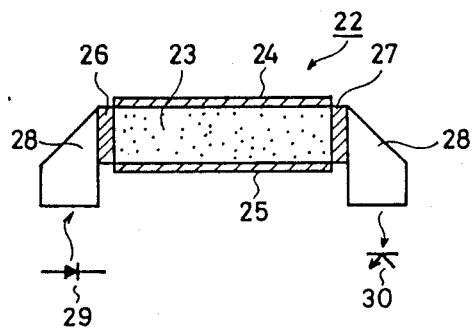
FIG. 2 is a schematic vertical sectional view of an electro-optical crystal element portion employed in one embodiment of the present invention.
Figure 3:
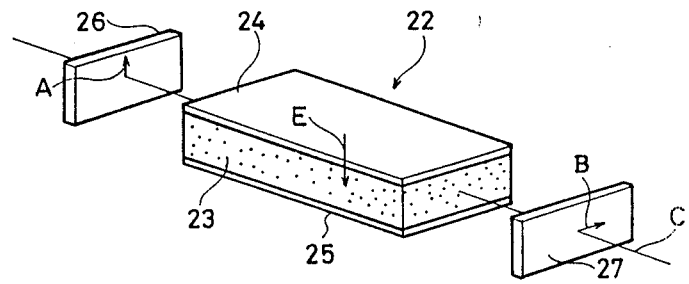
FIG. 3 is an exploded perspective view showing an overview of the electro-optical crytal element.

The electro-optical crystal element 22 comprises a polarizer 26 on the light receiving surface, and a photo detector 27 on the light emitting surface, as shown in FIG. 2. As is apparent from the schematic view of FIG. 3, the polarization axis (arrow A) of the polarizer 26 and the polarization axis (arrow B) of the photo detector 27 are shifted from each other by 90°, whereby the transmitted light is at its minimum level when there is no electric field applied to the electro-optical crystal 23. In FIG. 3, the line C represents the optical axis of the transmitted light which passes through the photodetector 27 and the adjacent optical waveguide 28. The arrow E represents the direction of the electric field applied to the electro optical crystal 23. As shown in FIG. 2, a pair of optical guides 28 are provided on the polarizer 26 and the photodetector 27 on the sides opposite to the electro-optical crystal 23. The light from the light emitting unit 29 formed of a light emitting diode is transmitted to the polarizer 26 through one of the optical guides 28. The light transmitted through the photodetector 27 is transmitted to the photosensitive unit 30 formed of a phototransistor through the other one of the optical guides 28. By means of the above described structure, the zero state of the electric field can be detected utilizing the electro optic effect (Pockels effect) of the electro-optical crystal 23. Although a primary electro optic effect is used in this example for the purpose of simplicity, electrical and optical designs employing a higher order electro optic effect may be available.

A zero electric field detecting circuit 31 is electrically connected to the photo sensitive portion 30 as shown in FIG. 1. The zero electric field detecting circuit 31 outputs a trigger signal to a hold circuit 32 when a minimum transmitted light amount, which is transmitted by the electro-optical crystal 23 when the electric field E is zero is detected by the photosensitive unit 30. The detecting operation makes use of the fact that the electric field generated between the surface 20 to be measured and the reference electrode 25 to which the high alternating voltage is applied becomes zero electric field when the high alternating voltage and the potential of the surface 20 to be measured coincide with each other. Upon reception of the trigger signal from the zero electric field detecting circuit 31, the hold circuit 32 holds the value of the alternating voltage which is in proportion to the high alternating voltage applied to the reference electrode 25, and outputs the value to the output circuit 33.

Meanwhile, a step up circuit 34 is electrically connected to the reference electrode 25 of the electro-optical crystal element 22. The step up circuit 34 is constituted by step up transformer, a capacitor and a resistance, not shown, and carries out an operation of stepping up, by a constant multiplication factor, the oscillating output provided by the oscillating circuit 35. Therefore, the high voltage applied from the setp up circuit 34 to the reference electrode 25 has a constant proportion to the oscillation output from the oscillating circuit 35. The oscillating circuit 35 has the oscillation output of the same phase as the high alternating voltage applied to the reference electrode 25, and the output is outputted to the hold circuit 32. The hold circuit 32 holds the peak value of the oscillation output at the time the trigger signal is inputted. The hold circuit 32 receives the oscillation output from the oscillating circuit output 35, which is also inputted to the hold circuit 32, and the trigger signal from the zero electric field detecting circuit 31. The output circuit 33 receving the signal from the hold circuit 32 outputs the voltage value held by the hold circuit 32, at an output terminal 36. Consequently, the potential of the surface 20 to be measured can be known from the oscillation output at the time the potential of the reference electrode 25 and that of the surface 20 coincide with each other.

The operation of the surface potential detecting apparatus 21 will be described in the following with reference to FIGS. 4A to 4E.

Figure 4A:
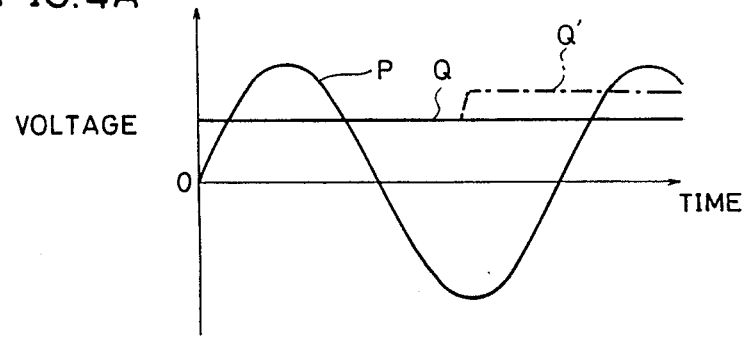
FIGS. 4A to 4E show waveforms illustrating the operation of the surface potential detecting apparatus.
Figure 4B:
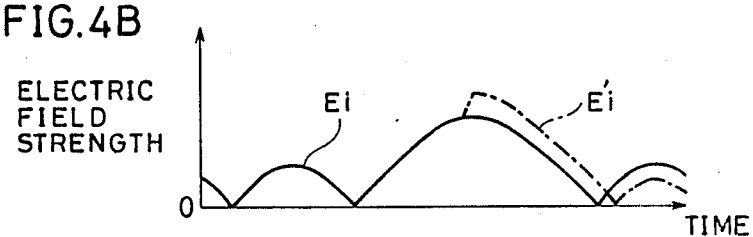
Figure 4C:
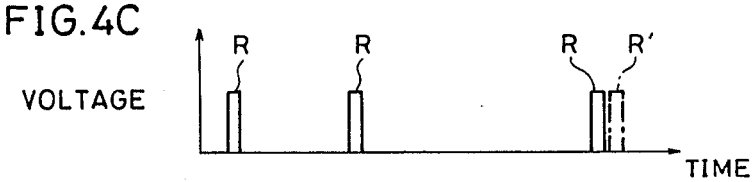

As shown in FIG. 4A, an alternating voltage represented by the curve P is applied to the reference electrode 25. Meanwhile, the potential of the surface 20 to be measured is represented by, for example, the line Q. If it is assumed that the relation between the reference electrode 25 and the surface to be measured is such as shown in FIG. 4A, the internal electric field strengths of the electro-optical crystal 23 will be represented by the waveform Ei shown in FIG. 4B. More specifically, when the potential of the reference electrode 25 and that of the surface to be measured coincide with each other, the internal electric field strengths in the electro-optical crystal 23 will be zero, and when they do not coincide with each other there will be an internal electric field, which corresponds to the difference between the potential of the reference electro 25 and that of the surface 20 to be measured, generated in the electro-optical crystal 23. Based on the change of the strength of the electric field shown in FIG. 4B, the polarization axis of the light passing through the electro optical crystal 23 is deflected, and the amount of light received by the photo sensitive portion 30 changes. The amount of light received by the photo sensitive portion 30 is at its minimum when the internal electric field of the electro optical crystal 23 becomes zero, due to the deviation of the polarization axis of the polarizer 26 and the photo detector 27. When the minimum transmitted light amount is detected, the zero electric field detecting circuit 31 outputs a trigger signal R such as shown in FIG. 4C to the hold circuit 32.

Figure 4D:
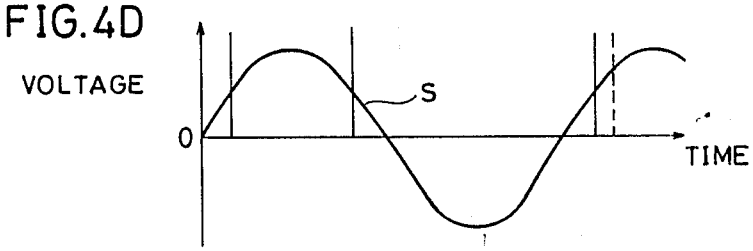
Figure 4E:
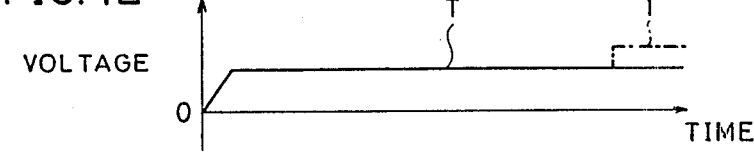
Figure 6:
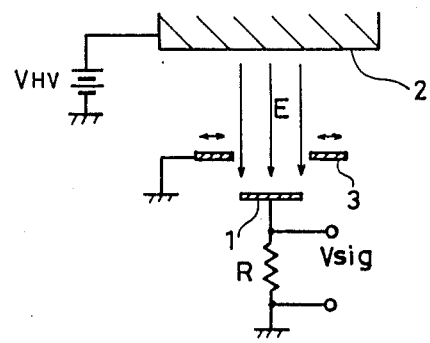
FIGS. 6, 7 and 8 respectively show schematic structures of the prior art.
Figure 7:
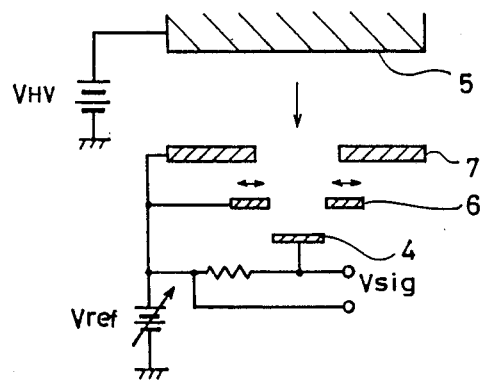
Figure 8:
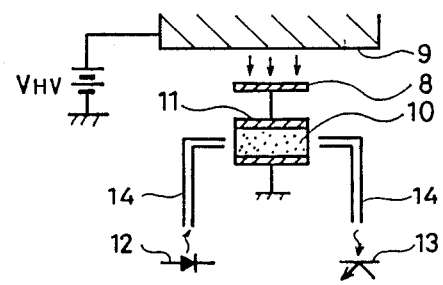

Meanwhile, an oscillation output S, having the same phase as the alernating voltage (P in FIG. 4A) applied to the reference electrode 25, is inputted to the hold circuit 32 from the oscillating circuit 35, as shown in FIG. 4D. The hold circuit 32 holds the value of the oscillation output S at the time the trigger signal R shown in FIG. 4C is inputted. Consequently, the held voltage T as shown in FIG. 4E is outputted by the output circuit 33.

Now, let us assumed that the voltage of the surface 20 to be measured changes from Q to Q' in FIG. 4A. In this case, the internal electric field strength of the electro-optical crystal 23 changes as shown by a chain-dotted line E'i in FIG. 4B, in association with the change of the voltage. As a result, the time when the internal electric field of the electro-optical crystal 23 becomes zero is delayed. Consequently, the trigger signal R outputted from the zero electric field detecting circuit 31 is outputted slightly delayed as shown by the character R' in FIG. 4C. Accordingly, the value of the oscillation output S at the time when the trigger signal R' is inputted becomes higher by the amount of the delay of the trigger signal R' to the hold circuit 32, and thus, the voltage value held in the hold circuit 32 also becomes higher. Consequently, the value of the output voltage T outputted from the output circuit 33 also becomes higher as shown at T' in FIG. 4E.

The surface potential detecting apparatus 21 can detect the potential of the surface 20 to be measured by the above described operation.

In addition, since an alternating voltage is applied to the reference electrode 25 in the surface potential detecting apparatus 21, the dust that is attracted to the electro optical crystal element 22 due to its charge can be reduced, and therefore, the degradation of the detecting precision caused by the dust can be prevented. By increasing the oscillation frequency from the oscillating circuit 35, the responsiveness of the surface potential detecting apparatus 21 can be improved.

Figure 5:
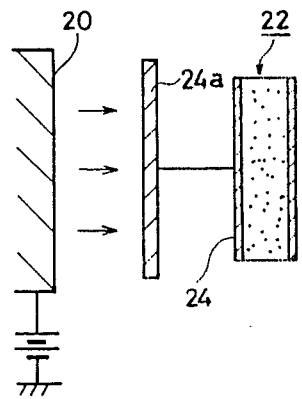
FIG. 5 is a partial vertical sectional view of another embodiment of the present invention.

The structures shown in FIG. 5 may be employed instead of the structure in which the electric field of the surface 20 to be measured is directly applied to the measuring electrode 24.

Referring to FIG. 5, a separately provided electrode 24a is electrically connected to the measuring electrode 24 of the electro-optical crystal element 23. The electrode 24a receives the electric field from the surface 20 to be measured. Consequently, a voltage is applied from the electrode 24a to the measuring electrode 24 based on the electric field generated on the surface 20 to be measured. In this case also, the potential of the surface 20 to be measured can be detected in a similar manner as in the above described embodiment based on the electric field generated between the measuring electrode 24 and the reference electrode 25.

In accordance with the surface potential detecting apparatus of these embodiments of the present invention, the following effects can be provided.

(a) Since the apparatus is an active type employing a reference electrode, the detection output does not fluctuate even if the distance between the surface to be measured and the detecting apparatus is changed, and therefore the measurement can be carried out at high speed in a simple manner.

(b) Since the apparatus employs an electro optical crystal and has no portion whch is mechanically movable, its precision is not degraded by mechanical factors.

(c) Since an electro optical crystal is employed to eliminate mechanically movable portions, the surface potential detecting apparatus itself can be made compact.

(d) Since a structure is employed in which the minimum value of the electric field strength formed between a measuring electrode and a reference electrode is detected inorder to indicate the value of an intensity of the transmitted light, the characteristics of the electro-optical crystal to be employed need not be strictly limited, whereby, inexpensive electro optical crystals may be employed. Therefore, the surface potential detecting apparatus can be provided at lower cost.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A surface potential detecting apparatus comprising:
    an electro-optical crystal element having a measuring electrode thereon to which an electric field from a surface to be measured is directly or indirectly applied, and a reference electrode thereon for receiving a reference potential, to establish a potential difference between itself and said measuring electrode;
    alternating voltage means for supplying said reference potential as an alternating voltage of a prescribed frequency to said reference electrode;
    detecting means for detecting the electric field strength formed between said measuring electrode and said reference electrode as by measuring an intensity of light transmitted through said crystal element; and
    means for deriving the electric field strength of the surface to be measured based on the detected intensity of the transmitted light.

2. A surface potential detecting apparatus according to claim 1, wherein:
    said electro optical crystal element comprises entrance side polarizing means provided on an entrance side, and emitting side polarizing means provided on an emitting side with a polarization axis deflected in relation to said entrance side polarizing means.

3. A surface potential detecting apparatus according to claim 2, further comprising
a detecting electrode disposed with respect to said apparatus such that the electric field from said surface to be measured may be directly applied thereto,
with said measuring electrode of said electro optical crystal element being electrically connected to said detecting electrode.

4. A surface potential detecting apparatus according to claim 1, wherein:
said electro optical crystal element comprises a single bulk crystal or a thin film mainly formed of a material selected from the group consisting of $BaTiO_3$, $Ba_2NaNbO_{15}$, $(K, Li)NbO_3$, $LiTaO_3$, $(Sr, Ba)Nb_2O_6$.

5. A surface potential detecting apparatus according to claim 4, wherein:
said electro optical crystal element comprises a ceramic polycrystalline bulk material.

6. A surface potential detecting apparatus according to claim 1, wherein said detecting means comprises:
light emitting means for supplying light to said electro-optical crystal element;
photosensitive means for receiving the light transmitted from said electro-optical crystal element;
zero electric field detecting means for detecting that the electric field in said electro-optical crystal element is zero, on the basis of an amount of the transmitted light detected by said photosensitive means;
output means for outputting an output voltage level when said zero electric field detecting means detects that the electric field inside the electro-optical crystal element is zero.

7. A surface potential detecting apparatus according to claim 6, wherein said output means comprises:
holding means for receiving and holding a voltage value generated by said alternating voltage generating means, in response to a trigger signal from said detecting means;
said detecting means generating said trigger signal when said electric field inside the electro-optical crystal element is zero; and
an output circuit which outputs said voltage value as said output voltage level, which has been received and held by said holding means.

8. A surface potential detecting apparatus according to claim 1, wherein said electro-optical crystal element comprises a single bulk crystal or a thin film mainly formed of a $LiNbO_3$.

9. A surface potential detecting apparatus comprising:
an electro-optical crystal element having measuring electrode means thereon which is disposed and adapted for being exposed to an electric field from a surface to be measured, and reference electrode means thereon which receives a reference signal and thereby establishes an internal electric field between said measuring electrode means and said reference electrode means;
AC voltage generating means for supplying an AC signal as said reference signal to said reference electrode means;
detecting means for measuring the strength of said internal electric field as a function of the intensity of light transmitted through said crystal element; and
means for determining the electric potential of said surface to be measured as a function of said detected internal electric field strength.

10. A surface potential detecting apparatus according to claim 9, wherein said detecting means comprises:
light-emitting means for directing light through said electro-optical crystal element;
photosensitive means for receiving the light transmitted through said element;
electric field level detecting means responsive to said photosensitive means for detecting when said internal electric field has a predetermined level as a function of the light received by said photosensitive means; and
output means for outputting an output signal when said electric field level detecting means detects that said internal electric field has said predetermined level.

11. A surface potential detecting apparatus according to claim 10, wherein said predetermined level is zero.

12. A surface potential detecting apparatus according to claim 10, wherein said output signal is an output voltage level.

13. A surface potential detecting apparatus according to claim 10, wherein said output means comprises:
holding means for receiving and holding a voltage value generated by said AC voltage generating means, in response to a trigger signal from said detecting means;
said detecting means generating said trigger signal when said electric field inside the electro-optical crystal element has said predetermined level; and
an output circuit which outputs said voltage value as said output voltage level, which has been received and held by said holding means.

* * * * *